United States Patent [19]
Joo et al.

[11] Patent Number: 5,841,163
[45] Date of Patent: Nov. 24, 1998

[54] INTEGRATED CIRCUIT MEMORY DEVICES HAVING WIDE AND NARROW CHANNEL STOP LAYERS

[75] Inventors: Kyung-joong Joo, Kyungki-do; Jeong-hyuk Choi, Seoul, both of Rep. of Korea

[73] Assignee: Samsung Electronics Co., Ltd., Suwon, Rep. of Korea

[21] Appl. No.: 701,627

[22] Filed: Aug. 22, 1996

[30] Foreign Application Priority Data

Aug. 24, 1995 [KR] Rep. of Korea .................. 95-26502

[51] Int. Cl.⁶ .................. H01L 29/788; H01L 29/76; H01L 29/94
[52] U.S. Cl. .................. 257/316; 257/398; 257/399; 257/400
[58] Field of Search .................. 257/314, 315, 257/316, 326, 389, 395, 396, 398, 399, 400

[56] References Cited

U.S. PATENT DOCUMENTS

| | | | |
|---|---|---|---|
| 5,194,924 | 3/1993 | Komori et al. | 257/316 |
| 5,464,784 | 11/1995 | Crisenza et al. | 437/43 |
| 5,545,907 | 8/1996 | Maari | 257/315 |
| 5,545,911 | 8/1996 | Otsuki et al. | 257/376 |
| 5,556,798 | 9/1996 | Hong | 437/43 |
| 5,568,418 | 10/1996 | Crisenza et al. | 364/185.01 |
| 5,656,839 | 8/1997 | Komori et al. | 257/316 |

Primary Examiner—Ngân V. Ngô
Attorney, Agent, or Firm—Myers Bigel Sibley & Sajovec

[57] ABSTRACT

An integrated circuit memory device includes a semiconductor substrate having a memory cell area and a select transistor area. A first field insulation layer is included in the memory cell area, and a first channel stop impurity layer is included beneath the first field insulation layer. The first channel stop impurity layer is narrower than the first field insulation area. A second field insulation layer is included in the select transistor area, and a second channel stop impurity layer is included beneath the second field insulation layer. The second channel stop impurity layer is wider than the second field insulation layer. Integrated circuit memory devices are fabricated by defining a memory cell area and a select transistor area of a semiconductor substrate. The memory cell area includes a memory cell active area and a memory cell field area. The select transistor area includes a select transistor active area and a select transistor field area. First channel stop impurity ions are implanted into the select transistor field area. A first field insulation layer is formed in the memory cell field area, and a second field insulation layer is formed in the select transistor field area, such that the first channel stop impurity ions lie beneath the second field insulation area. Second channel stop impurity ions are implanted through the central portion of the first field insulation area, such that the second channel stop impurity ions lie beneath the central portion of the first field insulation layer.

5 Claims, 7 Drawing Sheets

INTEGRATED CIRCUIT MEMORY DEVICES HAVING WIDE AND NARROW CHANNEL STOP LAYERS

FIELD OF THE INVENTION

This invention relates to integrated circuit devices such as integrated circuit memory devices and fabrication methods therefor, and more particularly to device isolation areas for integrated circuit devices such as integrated circuit memory devices and fabrication methods therefor.

BACKGROUND OF THE INVENTION

Integrated circuit devices, such as integrated circuit memory devices, and more specifically flash memory devices, include large numbers of active devices such as transistors. For proper operation, the transistors are generally electrically isolated from one another. As the integration density increases, and device dimensions decrease, device isolation has become increasingly difficult.

Various technologies have been developed for improving device isolation. For example, local oxidation of silicon (LOCOS), poly buffered LOCOS and trench isolation have been widely used. In the above technologies, a channel stop impurity layer is often formed beneath a field insulating layer, to improve isolation. The structure of the channel stop impurity layer can impact the effectiveness of device isolation.

FIG. 1 is a plan view showing a portion of a memory cell array area of a conventional NAND type flash EEPROM memory device. The structure of the memory cell array area shown in FIG. 1 will now be described. Reference numeral 20 represents a memory cell array area. The memory cell array area 20 is divided into an active area 1 and a field area 3. A word line 5 and select transistor lines 7 and 9 are arranged as shown, intersecting the field area 3. Contact holes 13 for connecting the active areas 1 to a metal wire (not shown) are arranged in the active areas 1 between the two adjacent select transistor lines 9. The area in which the word lines 5 are arranged, and the area in which the select transistor lines 7 and 9 are arranged, are referred to as a "memory cell area" CA and a "select transistor area" SA, respectively.

Memory cell transistors 19 are arranged between the select transistor lines 7 and 9 and pass through the active areas 1. In order to electrically isolate the memory cell transistors 19, channel stop impurity layers 37, 38 and 39 are arranged in the field area 3.

FIG. 2 is a cross-sectional view showing a portion of the memory cell array area 20 of FIG. 1, along line A–A' of FIG. 1. A first field oxide layer 35 is formed in the field area FA of the memory cell array CA of a semiconductor substrate 21. A second field oxide layer 36 is formed in the field area FA of the select transistor area SA. A first channel stop impurity layer 37 beneath the first field oxide layer 35, extends laterally across the entire field area FA to the active area AA. A second channel stop impurity layer 39 beneath the first field oxide layer 35, is formed only within the field area FA. Also, a third channel stop impurity layer 38, extending laterally across the entire field area FA to the active area AA, is formed beneath the second field oxide layer 36.

FIGS. 3 to 7 are cross-sectional views illustrating a method for fabricating the memory cell array area 20 of FIG. 2. FIG. 3 shows fabrication of a pad oxide layer 23, a polysilicon layer 25 and a nitride layer 27 on a semiconductor substrate 21. The nitride layer 27 formed on the polysilicon layer 25 is an oxidation prevention layer, to prevent the oxidation of the polysilicon layer 25 and the semiconductor substrate 21 when a field oxide layer is later formed by a thermal oxidation process. The pad oxide layer 23 is used as a buffering layer to alleviate stress between the nitride layer 27 and the semiconductor substrate 21.

FIG. 4 illustrates the step of defining an active area AA and a field area FA. In detail, a photoresist layer is formed on the nitride layer 27 and then patterned to form a photoresist pattern 29A defining the field area FA. The nitride layer 27 is etched using the photoresist pattern 29A as a mask. The portions of the nitride layer 27 which are etched define the field area FA and the portions of the nitride layer 27 which are not etched define the active area AA. Then, the photoresist pattern 29A is removed.

FIG. 5 is a diagram illustrating the step of implanting first channel stop impurity ions into the field area FA to form a first channel stop impurity layer. In detail, first channel stop impurity ions 26 are implanted into the entire upper face of the semiconductor substrate 21. The impurity implantation energy is based on the thickness of the multi-layered structure of the nitride layer pattern 27A, the polysilicon layer 25 and the pad oxide layer 23, so as to prevent the implantation of the first channel stop impurity ions 26 into the active area AA.

FIG. 6 illustrates implanting second channel stop impurity ions 28 to form a second channel stop impurity layer 39 in the field area FA of the memory cell area CA. In detail, a photoresist layer is formed on the entire upper face of the multilayered structure described in FIG. 5, and then patterned to form a photoresist pattern 33A, having a hole 15A which is more narrow than the field area FA of the memory cell area CA.

Then, the polysilicon layer 25 is etched using the photoresist pattern 33A as a mask. The second channel stop impurity ions 28 are then implanted into the entire face of the semiconductor substrate 21. Implantation energy of the second channel stop impurity ions 28 should be controlled to implant the second channel stop impurity ions 28 within the first channel stop impurity layer. Also, the concentration of the second channel stop impurity ions 28 should be higher than that of the first channel stop impurity ion 26 shown in FIG. 5. The implantation energy of the second channel stop impurity ions 28 should be based upon the thickness of the multilayered structure formed of the photoresist pattern 33A, the nitride layer pattern 27A, the polysilicon layer 25 and the pad oxide layer 23, to prevent the implantation of the second channel stop impurity ions 28 into the active region.

FIG. 7 is a diagram illustrating the step of forming the field oxide layers and the first and second channel stop impurity layers. After removing the photoresist pattern 33A, the remaining structure undergoes a thermal treatment. Accordingly, the pad oxide layer 23 is grown as the first and second field oxide layers 35 and 36 while the polysilicon layer 25 of the field area FA is oxidized. Also, the channel stop impurity layers formed in the field area FA are diffused during the thermal process.

As a result, the first and second field oxide layers 35 and 36 are formed in the field areas FA of the memory cell area CA and the select transistor area SA, respectively. Also, the first channel stop impurity layer 37 and the second channel stop impurity layer 39 are formed beneath the first field oxide layer 35, wherein the second field stop impurity layer 39 is included in the first channel stop impurity layer 37. At the same time, the third channel stop impurity layer 38 is formed beneath the second field oxide layer 36.

The first channel stop impurity layer 37 is diffused laterally over the field area FA and into the active area AA, however, the second channel stop impurity layer 39 is formed to be more narrow than the field area FA. The third channel stop impurity layer 38 is diffused laterally over the field area FA and into the active area AA, like the first channel stop impurity layer 37. Subsequently, the nitride layer pattern 27A, the polysilicon layer 25 and the pad oxide layer 23 are etched.

As described above, according to a conventional method, the channel stop impurity layers 37 and 38 formed in the memory cell area CA, extend into the active area AA, thereby reducing the channel width of the memory cell transistor which is formed in the active area. As a result, the drive current or junction breakdown voltage of the memory cell transistor may be reduced. Also, when reading information from the memory cell transistor, hot electrons may be generated at the interface between the channel of the transistor and the channel stop impurity layer to form a trap in the gate oxide layer, thereby reducing reliability. Finally, it is difficult to use photolithography to form the transistors of the flash memory cell when the highly integrated flash memory device has a submicron spacing between the transistors.

SUMMARY OF THE INVENTION

It is therefore an object of the present invention to provide improved isolation structures and methods for integrated circuit devices such as integrated circuit memory devices.

It is another object of the present invention to provide isolation structures and methods for integrated circuit devices such as memory devices which do not require reduction of the channel width of transistors and which can reduce the generation of hot electrodes.

These and other objects are provided, according to the present invention, by an integrated circuit memory device which includes a semiconductor substrate having a memory cell area and a select transistor area. A first field insulation layer is included in the memory cell area, and a first channel stop impurity layer is included beneath the first field insulation layer. The first channel stop impurity layer is narrower than the first field insulation layer. A second field insulation layer is preferably included in the select transistor area, and a second channel stop impurity layer is preferably included beneath the second field insulation layer. The second channel stop impurity layer is wider than the second field insulation layer.

By providing a first channel stop impurity layer beneath the first field insulation layer which is narrower than the first field insulation layer, the channel width of the memory cell transistors need not be decreased, and the isolation characteristics may be improved. The drive current of the memory cell need not be decreased due to the decreased channel width, and hot electrons need not be generated when reading the data stored in the memory cell transistor. It will be understood by those having skill in the art that the isolation structures and methods of the present invention may also be used in integrated circuits which are not memory devices.

Integrated circuit memory devices with improved isolation may be fabricated, according to the invention, by defining a memory cell area and a select transistor area of a semiconductor substrate. The memory cell area includes a memory cell active area and a memory cell field area. The select transistor area includes a select transistor active area and a select transistor field area. First channel stop impurity ions are implanted into the select transistor field area. A first field insulation layer is formed in the memory cell field area, and a second field insulation layer is formed in the select transistor field area, such that the first channel stop impurity ions lie beneath the second field insulation area. Second channel stop impurity ions are implanted through the central portion of the first field insulation area, such that the second channel stop impurity ions lie beneath the central portion of the first field insulation layer.

In a preferred embodiment, a gate insulation layer and a conductive layer are respectively formed on the semiconductor substrate prior to the step of implanting second channel stop impurity ions. A portion of the conductive layer is removed to expose the central portion of the first field insulation layer. The second channel stop impurity ions are then implanted through the exposed central portion of the first field insulation layer. Preferably, the first and second ions are boron ions. It will be understood that isolation methods according to the invention may also be used for integrated circuits which are not memory devices.

DETAILED DESCRIPTION OF PREFERRED EMBODIMENTS

Figure 1:
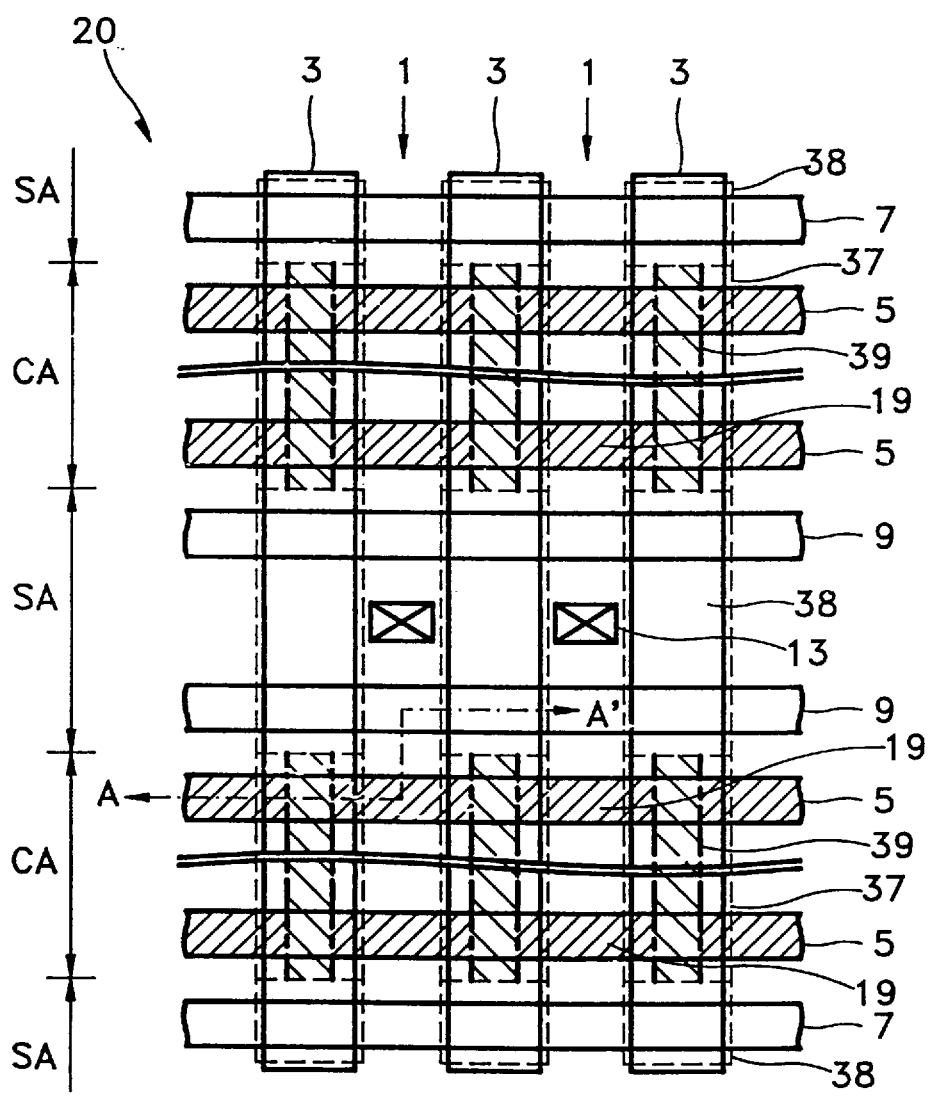
FIG. 1 is a plan view showing a portion of a memory cell array area of a conventional NAND type flash EEPROM.
Figure 2:
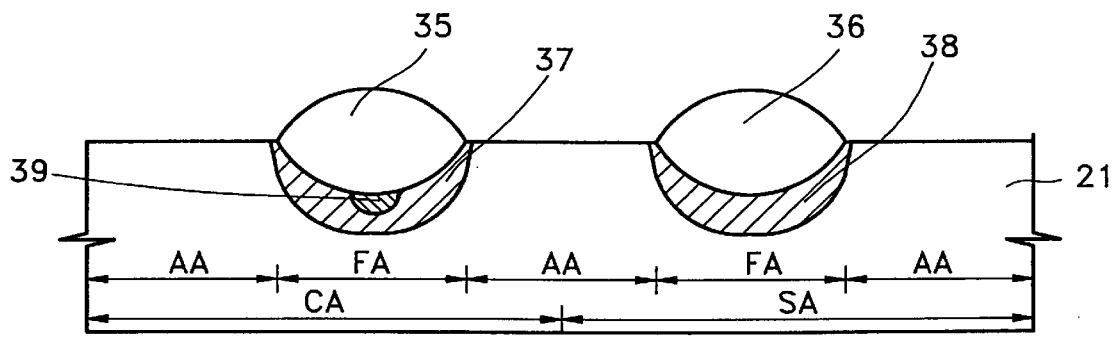
FIG. 2 is a cross-sectional view showing a portion of the memory cell array area shown in FIG. 1.
Figure 3:
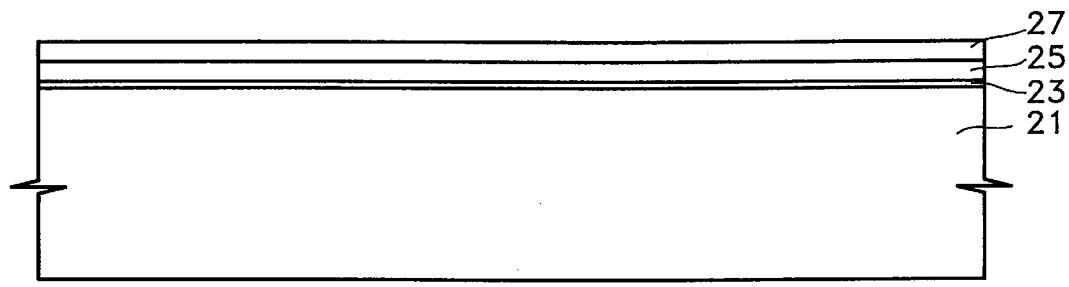
FIGS. 3 to 7 are cross-sectional views illustrating a method for fabricating the memory cell array area shown in FIG. 2.
Figure 4:
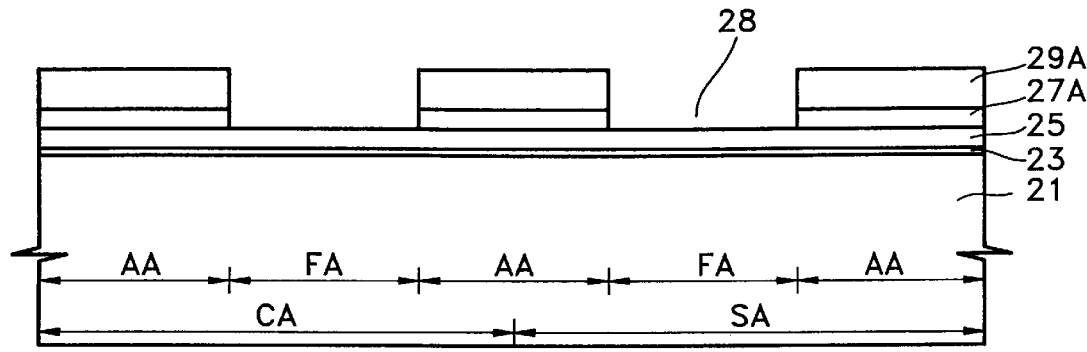
Figure 5:
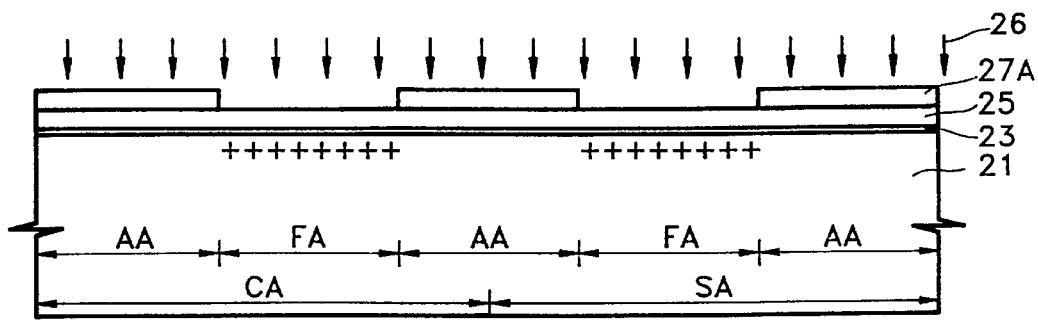
Figure 6:
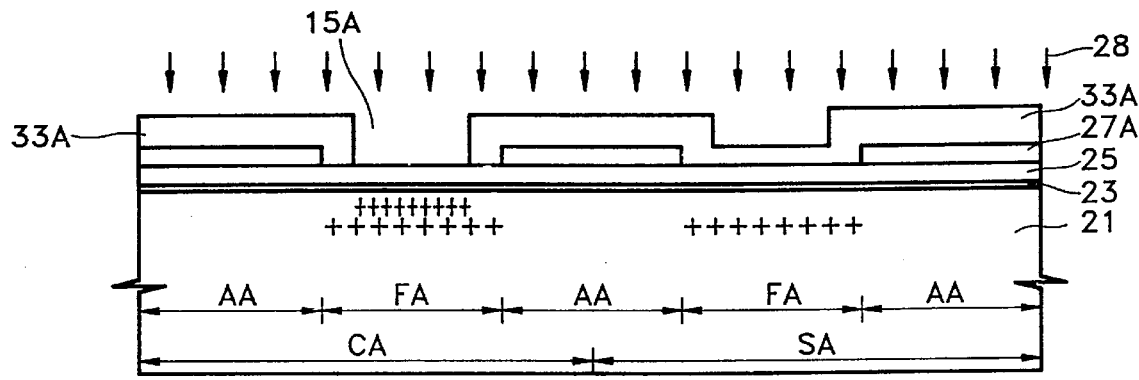
Figure 7:
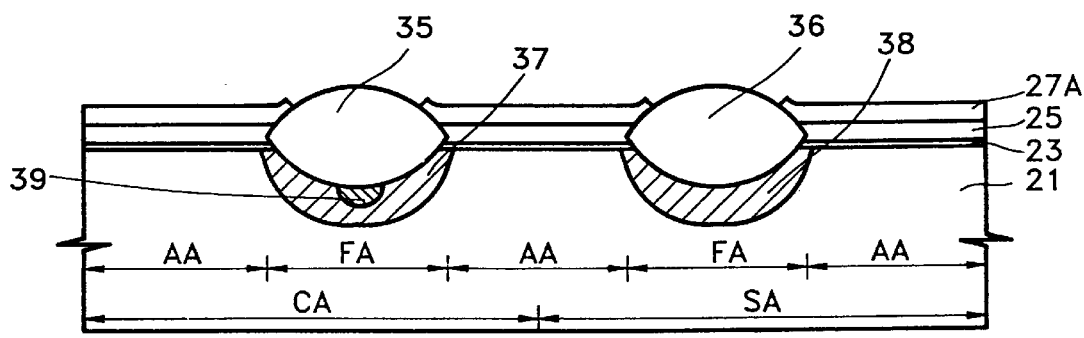

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary (n or p type) embodiment as well.

Figure 8:
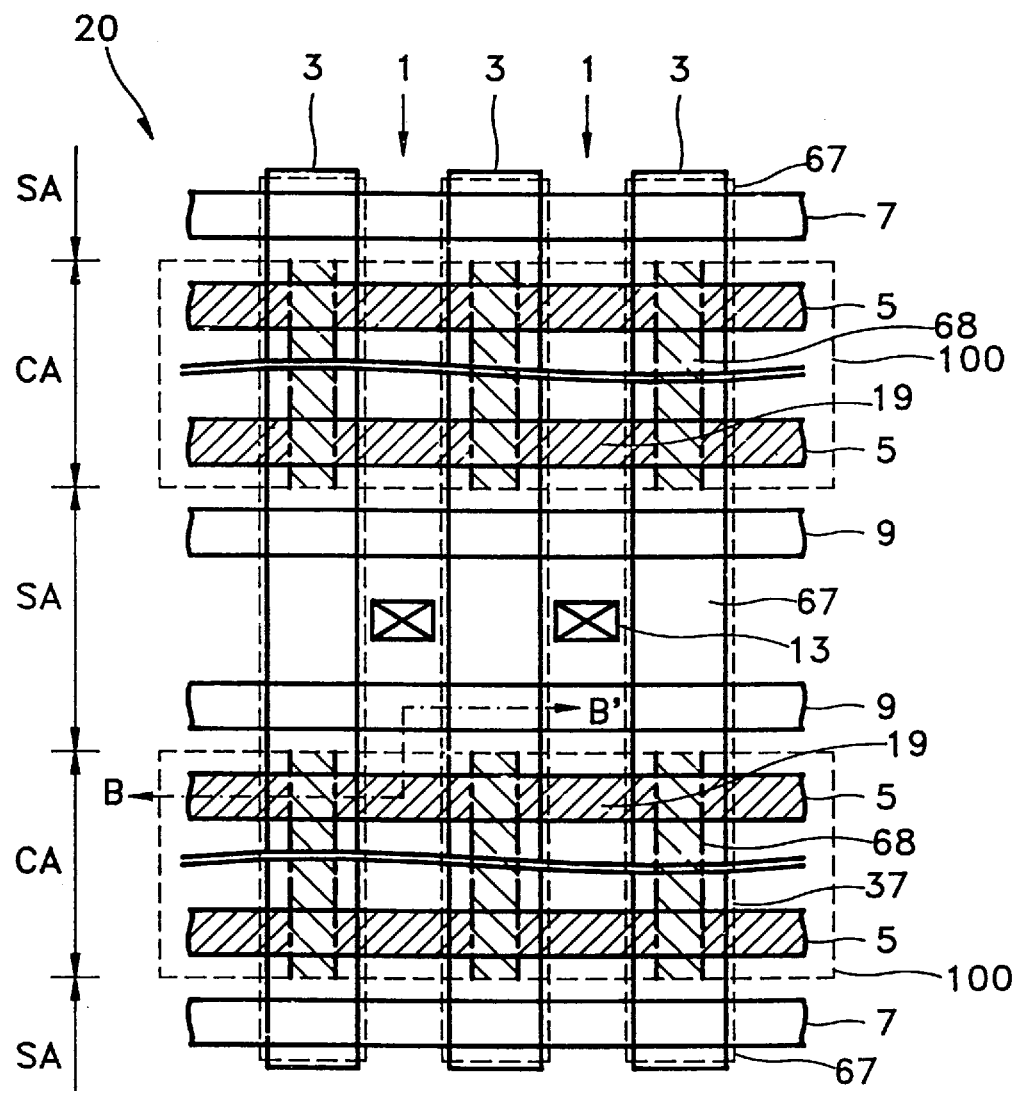
FIG. 8 is a plan view showing a portion of a memory cell array area of a NAND type flash EEPROM according to the present invention.

FIG. 8 is a plan view showing a portion of a memory cell array area of a NAND type flash EEPROM according to the present invention. The NAND type flash EEPROM shown in FIG. 8 has the same configuration as that shown in FIG. 1. However, unlike FIG. 1, only one channel stop impurity layer 68 is formed in a field area 3 of a memory cell area CA, and the channel stop impurity layer 68 is narrower than the field area 3. A mask 100 is arranged in the memory cell area CA, to prevent the implantation of first channel stop impurity ions therein when the first channel stop impurity ions are implanted in the memory cell array area 20 to form a first channel stop impurity layer 67.

Figure 9:
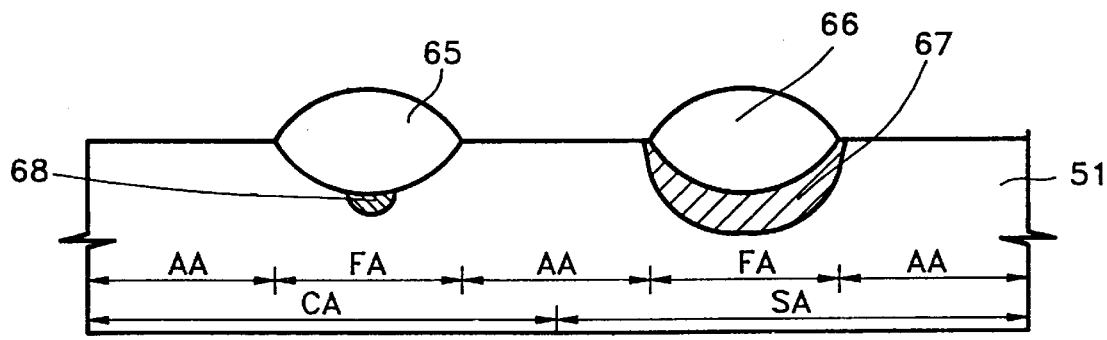
FIG. 9 is a cross-sectional view showing a portion of the memory cell array area shown in FIG. 8.

FIG. 9 is a cross-sectional view showing a portion of the memory cell array area 20, along line B–B' of FIG. 8. In detail, a first field oxide layer 65 is formed in a field area FA of a memory cell area CA and a second field oxide layer 66 is formed in a field area FA of a select transistor area (SA) of a semiconductor substrate 51. A first channel stop impurity area 68, having a narrower width than that of the field area FA, is formed beneath the first field oxide layer 65. Also, a second channel stop impurity layer 67 is formed beneath the second field oxide layer 66 extending laterally from an active area AA through the field area FA to another active area AA.

Figure 10:
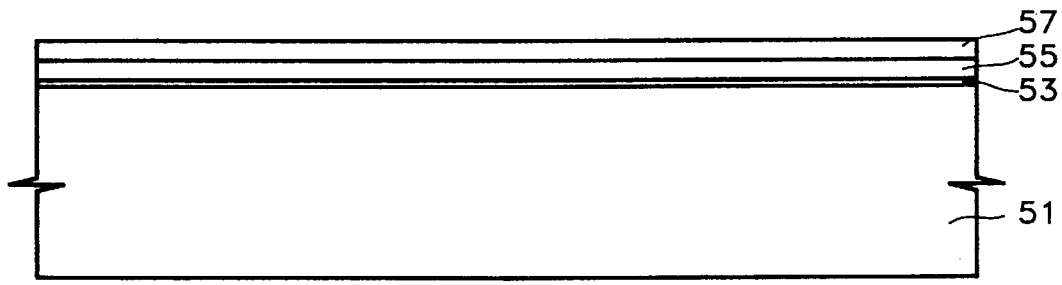
FIGS. 10 to 15 are cross-sectional views illustrating a method for fabricating the memory cell array are shown in FIG. 9.

FIGS. 10 to 15 are cross-sectional views illustrating a method for fabricating the portion of the memory cell array area 20 shown in FIG. 9. FIG. 10 shows fabrication of a pad oxide layer 53, a polysilicon layer 55 and a nitride layer 57 on the semiconductor substrate 51. The nitride layer 57 formed on the polysilicon layer 55 is an oxidation preventing layer for preventing the oxidation of the polysilicon layer 55 and the semiconductor substrate 51 when a thermal oxidation process is performed to form a field oxide layer. The pad oxide layer 53 is used as a buffering layer for buffering the stress between the nitride layer 57 and the semiconductor substrate 51.

Figure 11:
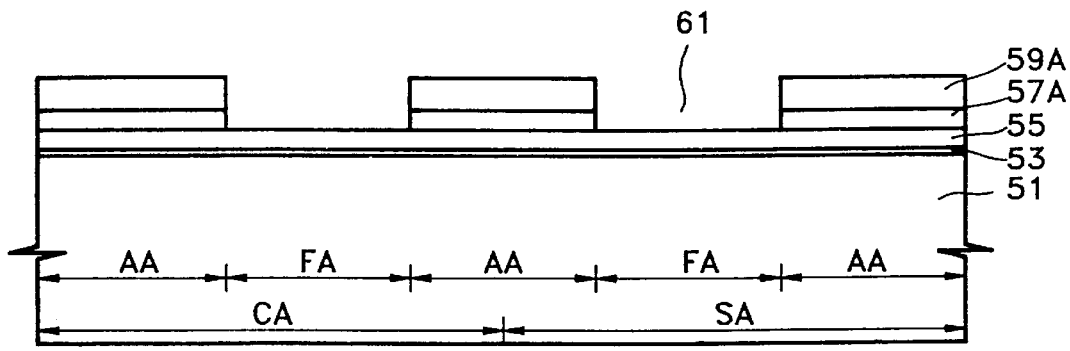

FIG. 11 is a cross-sectional view illustrating the step of defining the active area AA and the field area FA. In detail, a photoresist layer is formed on the nitride layer 57 and then patterned to form a photoresist pattern 59A for the field area FA. The nitride layer 57 is etched using the photoresist pattern 59A as a mask. The portions from which the nitride layer 57 are etched define the field area FA, and the remaining area of the nitride layer 57 which is not etched define the active area AA. Then, the photoresist pattern 59A is removed.

Figure 12:
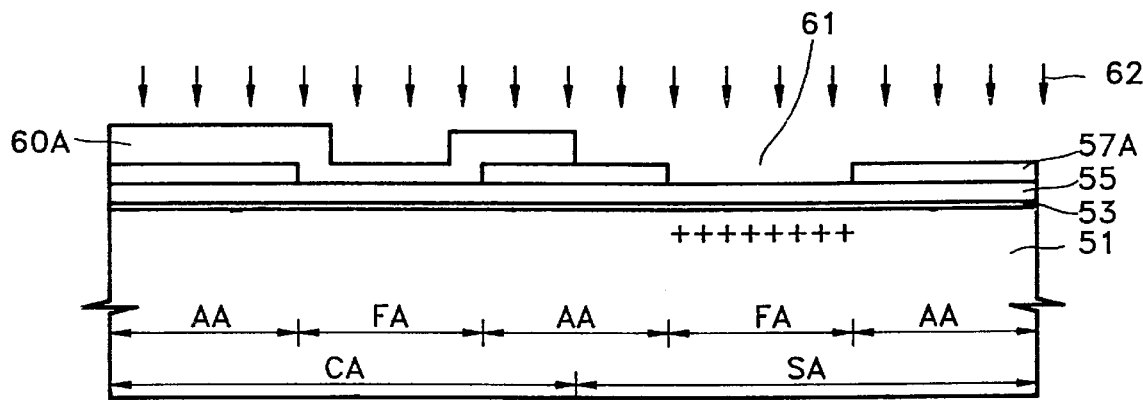

FIG. 12 is a cross-sectional view illustrating the step of implanting first channel stop impurity ions 62 to form a first channel stop impurity layer in the field area FA of the select transistors area SA. In detail, a photoresist layer is formed on the multilayered structure shown in FIG. 11. The photoresist layer is patterned to form a photoresist layer only on the memory cell area CA, like the mask 100 in the memory cell area shown in FIG. 8. This forms the photoresist pattern 60A, shown in FIG. 12.

Then, the first channel stop impurity ions 62 are implanted into the entire face of the semiconductor substrate 51. The first channel stop impurity ions 62 are only implanted into the field area FA of the select transistor area SA. The implantation energy of the first channel stop impurity ions should be controlled, based on the thickness of the multilayered structure formed of the nitride layer 57A, the polysilicon layer 55 and the pad oxide layer 53, so as to prevent the implantation of the first channel stop impurity ions 62 into the active area AA of the select transistor area SA and the memory cell area CA. Then, the photoresist pattern 60A is removed. Boron (B) is preferably used as the first channel stop impurity ion and the implantation dose is preferably about $2\times10^{13}$ to about $7\times10^{13}/cm^2$.

Figure 13:
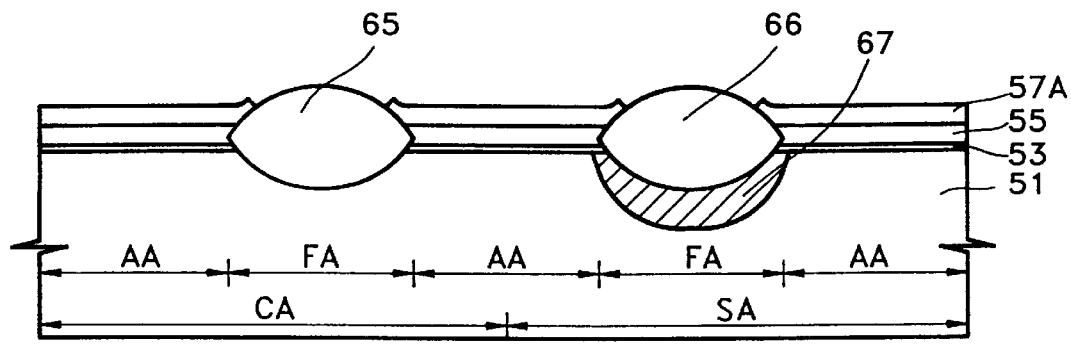

FIG. 13 is a cross-sectional view illustrating the step of forming a first field oxide layer 65 and a second field oxide layer 66. When the semiconductor substrate 51 undergoes thermal processing, the first field oxide layer 65 is formed in the field area FA of the memory cell area CA, and the second field oxide layer 66 is formed in the field area FA of the select transistor area, when the polysilicon layer 55 is oxidized.

During this process, the nitride layer pattern 57A is lifted at the boundary portion due to the formation of the first and second field oxide layers 65 and 66. Also, the first channel stop impurity ions implanted below the second field oxide layer 66 are diffused by the thermal process to form a first channel stop impurity layer 67. The first channel stop impurity layer 67 is formed in the field area FA with its ends extending into the active areas AA at each side thereof. Then, the nitride layer pattern 57A, the polysilicon layer 55 and the pad oxide layer 53 are removed.

Figure 14:
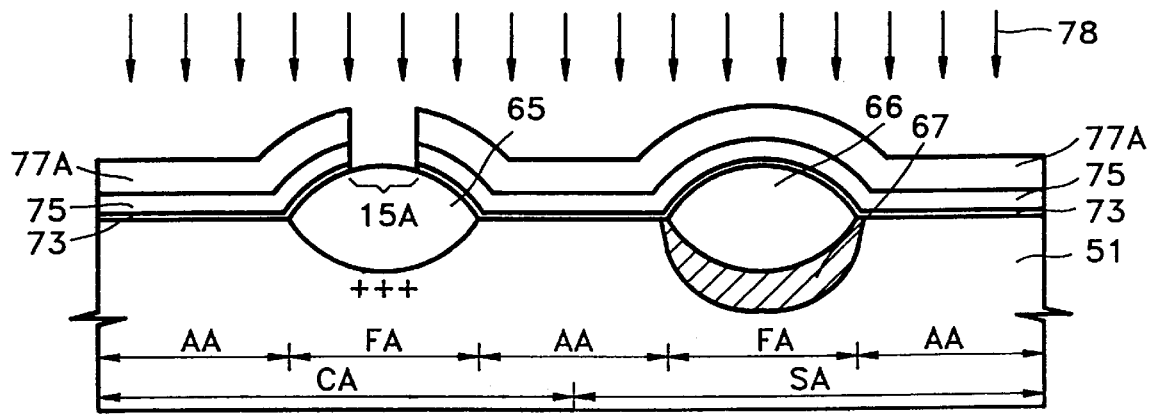

FIG. 14 is a cross-sectional view illustrating the step of implanting second channel stop impurity ions into the field area FA of the memory cell area CA to form a channel stop. In detail, in order to form a gate electrode of the memory cell transistor, a gate insulation layer 73 is formed on the entire face of the semiconductor substrate 51 shown in FIG. 12, using an oxide layer or an oxynitride layer. Then, a floating gate conductive layer 75 is formed on the entire face of the insulation layer 73. Preferably, either phosphoryl chloride ($POCl_3$) including a large amount of phosphorous is deposited on the floating gate conductive layer 75, or impurity ions are implanted into the floating gate conductive layer 75, thereby reducing the resistance thereof.

A photoresist layer is formed on the floating gate conductive layer 75 and then patterned to form a photoresist pattern 77A to expose only a center portion 15A of the first field oxide layer 65. The floating gate conductive layer 75 on the center portion 15A are removed using the photoresist pattern 77A as a mask, to form a field area hole 15B.

Then, second channel stop impurity ions 78 are again implanted into the field area hole 15B. The ion implantation energy should be controlled to allow the implantation of the second channel stop impurity ions 78 to pass through the first field oxide layer 65. Then, the photoresist pattern 77A is removed. Boron (B) is preferably used as the second channel stop impurity ions 78 and the implantation dose is preferably about $9\times10^{12}$ to about $3\times10^{13}/cm^2$.

Figure 15:
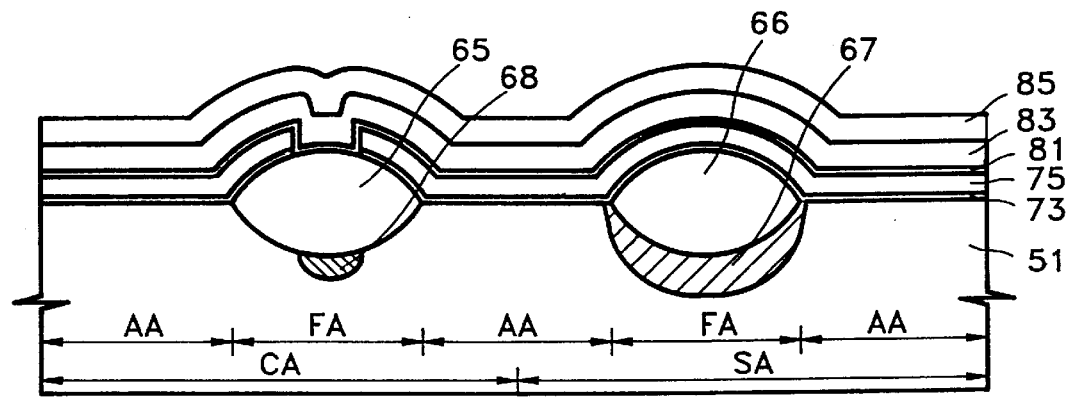

FIG. 15 is a cross-sectional view illustrating the step of forming a second channel stop impurity layer 18 beneath the first field oxide layer 65. In detail, a dielectric layer 81, a polysilicon layer 83 and a metal silicide layer 85 are sequentially formed on the floating gate conductive layer 75. Then, a photoresist layer (not shown) is formed on the metal silicide layer 85 and a photoresist pattern (not shown) for the gate of the memory cell transistor is formed. Subsequently, the metal silicide layer 85, the polysilicon layer 83, the dielectric layer 81, and the floating gate conductive layer 75 are patterned, using the photoresist pattern as a mask. The second channel stop impurity ions implanted into the semiconductor substrate 51 are diffused during the above process, thereby forming the second channel stop impurity layer 68 having a narrower width than the field area FA.

As described above, according to the present invention, since the channel stop impurity layer formed below the field oxide layer of the memory cell area CA is not diffused to the active area AA, reduction of the driving current and junction breakdown voltage of the memory cell transistor may be prevented. Hot electron generation when reading out the data stored in the memory cell transistor may be reduced. Also, when implanting impurity ions into the field oxide layer of the memory cell area CA, the ion implantation may be performed using an existing mask which forms the floating gate electrode, after the floating gate is etched, without requiring an extra mask. As a result, the spacing between the devices may be maintained within the submicron range, without adversely impacting the photolithography process.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device comprising:
    a semiconductor substrate including a memory cell area and a select transistor area;
    a first field insulation layer in said memory cell area;
    a first channel stop impurity layer beneath said first field insulation layer, and which is narrower than said first field insulation layer;
    a second field insulation layer in said select transistor area; and
    a second channel stop impurity layer beneath said second field insulation layer, and which is wider than said second field insulation layer.

2. An integrated circuit memory device according to claim 1 wherein said integrated circuit device is a flash memory device.

3. An integrated circuit memory device according to claim 1 further comprising:
    a plurality of word lines on said semiconductor substrate in said memory cell area; and
    a plurality of select transistors in said select transistor area.

4. An integrated circuit memory device according to claim 1 further comprising:
    an insulated polysilicon layer on the first field insulation area; and
    an insulated floating gate electrode on said second field insulation area, said insulated polysilicon layer extending onto said insulated floating gate electrode.

5. An integrated circuit memory device according to claim 1 wherein said first field insulation layer and said second field insulation area comprise respective first and second portions of a field insulation layer on a face of said semiconductor substrate.

* * * * *